(12) United States Patent
Nguyen

(10) Patent No.: US 6,381,181 B1
(45) Date of Patent: Apr. 30, 2002

(54) TIMING INDEPENDENT CURRENT COMPARISON AND SELF-LATCHING DATA CIRCUIT

(75) Inventor: Tam Nguyen, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/718,650

(22) Filed: Nov. 21, 2000

(51) Int. Cl.[7] ................................................. G11C 7/00
(52) U.S. Cl. ............................ 365/189.07; 365/189.05; 365/205
(58) Field of Search ...................... 365/189.05, 189.07, 365/205; 327/215, 219, 199, 208, 210

(56) References Cited

U.S. PATENT DOCUMENTS

| | | | | |
|---|---|---|---|---|
| 4,644,185 A | * | 2/1987 | Todd | 327/208 |
| 5,640,115 A | * | 6/1997 | Halepete et al. | 327/219 |
| 5,929,659 A | * | 7/1999 | Pantelakis et al. | 327/55 |
| 6,107,853 A | * | 8/2000 | Nikolić et al. | 327/217 |
| 6,222,765 B1 | | 4/2001 | Nojima | 365/185.08 |

* cited by examiner

Primary Examiner—Son Mai
(74) Attorney, Agent, or Firm—Gray Cary Ware & Freidenrich LLP

(57) ABSTRACT

The self-latching data circuit reads data from a pair of memory cells and latches the read data in response to a single transition of an enable signal. The self-latching data circuit includes a pair of PFETS that pull first and second nodes to a power supply voltage in response to an enable signal being in a low state. The self-latching data circuit also includes a pair of series connected PFET and NFETS in which the first and second data nodes are formed of the node connecting the series PFET and NFET together. In response to the enable signal transitioning to a high state, the memory cells are read and the contents thereof are applied to the first and second data nodes. The signal of one data node is applied to the gates of the transistors of the transistor pair corresponding to the other data node. This feedback causes the data cell having the greatest current draw to pull the other data node to the power supply level and pull itself to a zero voltage level to thereby latch the data. In the self-latched condition, the self-latching data circuit has minimal power draw.

7 Claims, 2 Drawing Sheets

TIMING INDEPENDENT CURRENT COMPARISON AND SELF-LATCHING DATA CIRCUIT

BACKGROUND OF THE INVENTION

The present invention relates to a self-latching data circuit, and more particularly to a self-latching data circuit with time independent current comparison and low power draw.

A flash memory is a type of non-volatile memory cell that is electrically reprogrammable. Flash memories are used in various electronic systems such as cellular telephones, personal data assistants (PDA), and notebook computers. The flash memories typically store boot up code that is executed at power up of the electronic system and a program code that is executed during the operation of the electronic system.

At power up, the data from the flash memory is loaded into a volatile memory, such as random access memory. Conventional memory systems load data from a memory cell into a latch circuit on a first transition of an enable signal and then latch the data in the latch circuit and disconnect the latch circuit from the memory cell in response to a second transition of the enable signal. Such conventional memory systems require that the width of the enable signal account for the time required to load before latching the data. Consequently, the conventional memory systems use a timer to determine the pulse width of the enable signal. This is problematic because the power signal is very noisy during power up which can disrupt the loading of the data.

FIG. 3 is a schematic diagram of a conventional memory cell. The conventional memory cell 300 comprises first and second inverters 302 and 304, respectively, first and second n-channel metal oxide semiconductor field effect transistors (NMOS transistors) 306 and 308, respectively, and first and second fuses 310 and 312, respectively. The first and second inverters 302 and 304 are cross-coupled as a latch circuit so that the output of the first inverter 302 is applied to the input of the second inverter 304, and the output of the second inverter 304 is applied to the input of the first inverter 302. The first and second NMOS transistors 306 and 308 couple the respective fuses 310 and 312 to the input of the respective inverters 302 and 304. An enable signal from a timer 314 is applied to the gates of the NMOS transistors 306 and 308 which couples the data stored in the fuses 310 and 312 to the latch circuit formed of the inverters 302 and 304. The enable signal is kept high for a predetermined time in order to allow the power of the circuit to reach a steady state and for the inverters 302 and 304 to latch the data from the fuses 310 and 312. After the predetermined time, the enable signal is changed to a zero state to turn off the transistors 306 and 308. The timer 314 must provide the enable signal for a sufficient predetermined time for the data to load and latch before turning off the transistors 306 and 308.

The pulse width of the enable signal in the conventional memory system must be sufficiently long for the circuit to latch. However, because the power signal is noisy during power up, the circuit may not sufficiently latched before the enable signal is disabled.

SUMMARY OF THE INVENTION

It is an object of the present invention to provide a data latch signal that is timing independent and draws low power.

The present invention provides a self-latching data circuit that comprises first and second memory cells. The self-latching data circuit also includes first and second n-channel field effect transistors (NFETs) coupled to the respective first and second memory cells for providing contents therein, in response to an enable signal having a first state applied to a gate of each of the first and second NFETs. A third NFET couples the first NFET to a first data node. A fourth NFET couples the second NFET to a second data node. The first data node is coupled to a gate of the fourth NFET. The second data node is coupled to the gate of the third NFET. A first p-channel field effect transistor (PFET) couples a voltage signal to the first data node in response to the enable signal having the first state being applied to a gate of the first PFET. A second PFET couples the voltage signal to the second data node in response to the enable signal having the first state being applied to a gate thereof. A third PFET couples the voltage signal to the first data node in response to the second data node. A fourth PFET couples the voltage signal to the second data node in response to the first data node.

The present invention also provides a circuit that comprises first and second subcircuits. The first subcircuit includes a first transistor of a first type having a drain coupled to the power signal line. A first transistor of a second type has a drain coupled to the source of the first transistor of the first type to form a first data node, has a gate coupled to the gate of the first transistor of the first type to form the first feedback node and has a source. A second transistor of the first type has a drain coupled to the power signal line, has a gate coupled to an enable signal line and the source coupled to the first data node. A second transistor of the second type has a drain coupled to the source of the first transistor of the second type, a gate coupled to the enable signal line and a source coupled to a first input node. The second subcircuit has a third transistor of a first type having a drain coupled to the power signal line. A third transistor of the second type has a drain coupled to the source of the third transistor of the first type to form a second data node and coupled to the first feedback node, a gate coupled to the gate of the third transistor of the second type to form a second feedback node and coupled to the first data node, and a source. A fourth transistor of the second type has a drain coupled to the power signal line, a gate coupled to the enable line and a source coupled to the second data node. A fourth transistor of the second type has a drain coupled to the source of the third transistor of the second type, a gate coupled to the enable signal line, and a source coupled to the second input node. The first and second input nodes may be coupled to first and second memory cells.

BRIEF DESCRIPTION OF THE DRAWINGS

FIG. 3 is a schematic diagram of a conventional memory cell.

DETAILED DESCRIPTION

Figure 1:
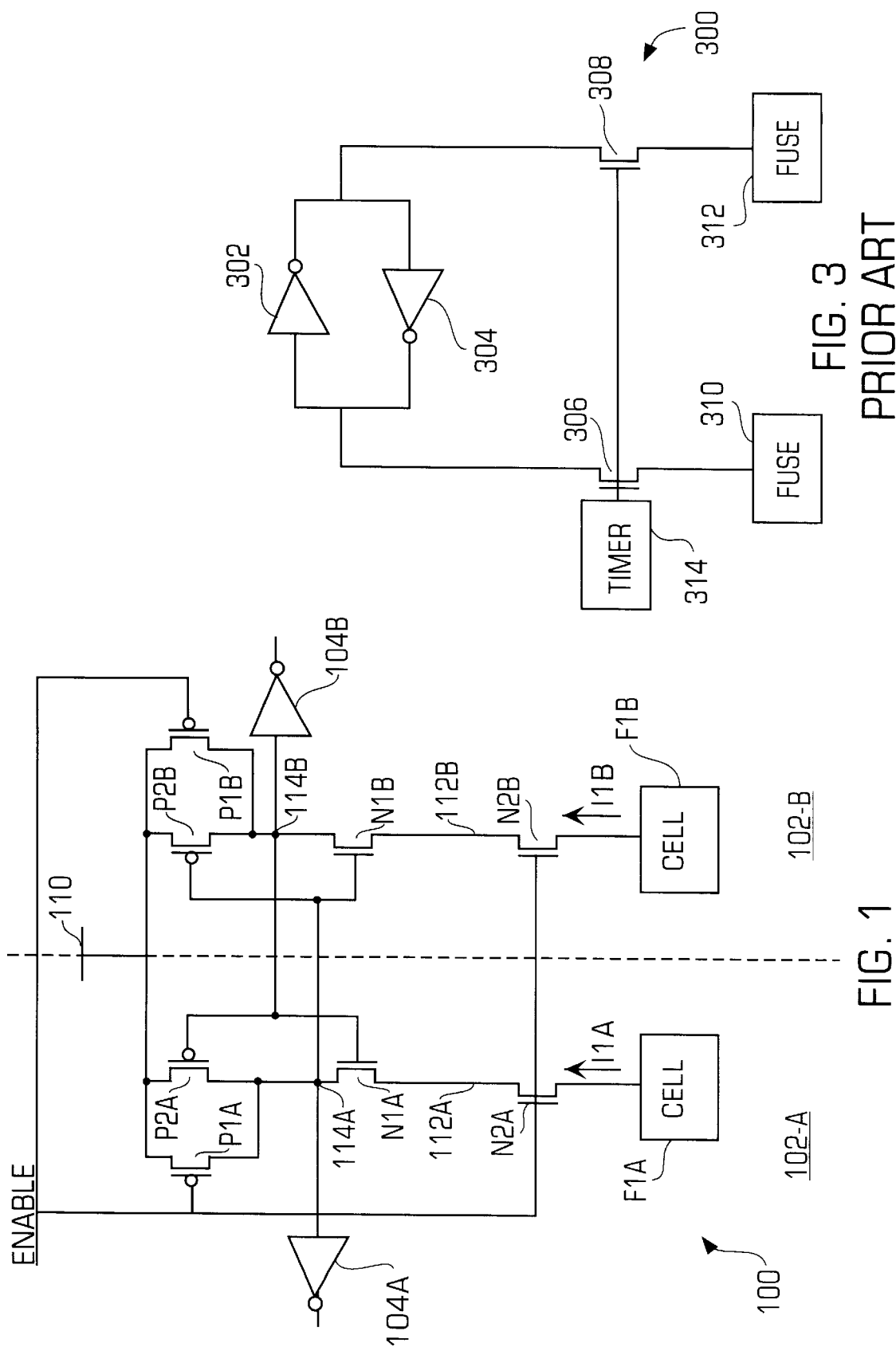
FIG. 1 is a schematic diagram of a self-latching data circuit according to the present invention.

FIG. 1 is a schematic diagram of a self-latching data circuit 100 according to the present invention. The self-latching data circuit 100 comprises a first branch 102-A and a second branch 102-B. The second branch 102-B is substantially identical to the first branch 102-A. In one embodiment of the present invention, the self-latching data circuit 100 is implemented in LSI silicon. The elements of the first and second branches 102-A and 102-B are each substantially identical to the corresponding element in the other branch.

The layout of the elements of the first branch 102-A and the layout of the elements of the second branch 102-B are symmetric to each other.

The first branch 102-A comprises PMOS transistors P1A and P2A, NMOS transistors N1A and N2A, a memory element F1A, and an inverter 104A. The second branch 102-B comprises PMOS transistors P1B and P2B, NMOS transistors N1B and N2B, a memory element F1B and an inverter 104B. The memory elements F1A and F1B may be, for example, fuses. For clarity, the memory elements F1A and F1B are hereinafter referred to as fuses F1A and F1B, respectively.

The first branch 102-A is described. The drain-source terminals of the PMOS transistors P2A and the NMOS transistor N1A are series coupled between a power signal line 110 and a first input node 112-A. The source of the PMOS transistor P2A and the drain of the NMOS transistor N1A are coupled together to form a first data node 114A. The gates of the PMOS transistor P2A and the NMOS transistor N1A are coupled together. The drain-source terminals of the PMOS transistor P1A couple the first data node 114A to the power signal line 10 in response to an enable signal being applied to the gate of the PMOS transistor P1A. The drain-source terminals of the NMOS transistor N2A couple the fuse F1A to the first input node 112-A and the source of the NMOS transistor N1A in response to the enable signal being applied to the gate of the NMOS transistor N2A. The NMOS transistor N1A couples a first data signal from the fuse F1A via the first input node 112-A to the first data node 114A in response to a first feedback signal having a high state being applied to the gate of the NMOS transistor N1A. The PMOS transistor P2A couples the first data node 114A to the power signal line in response to the first feedback signal having a low state being applied to the gate of the PMOS transistor P2A. The inverter 104A inverts and buffers the data stored on the first data node 114A.

The second branch 102-B is described. The drain-source terminals of the PMOS transistor P2B and the NMOS transistor N1B are series coupled between the power signal line 110 and a second input node 112-B. The source of the PMOS transistor P2B and the drain of the NMOS transistor N1B are coupled together to form a second data node 114B. The gates of the PMOS transistor P2B and the NMOS transistor N1B are coupled together. The drain-source terminals of the PMOS transistor P1B couples the second data node 114B to the power signal line 110 in response to the enable signal being applied to the gate of the PMOS transistor P1B. The drain-source terminals of the NMOS transistor N2B couples the fuse F1B to the second input node 112-B and the source of the NMOS transistor N1B in response to the enable signal being applied to the gate of the NMOS transistor N2B. The NMOS transistor N1B couples a second input data signal from the fuse F1B via the second input node 112-B to the second data node 114B in response to a second feedback signal having a high state being applied to the gate of the NMOS transistor N1B. The PMOS transistor P2B couples the second data node 114B to the power signal line 110 in response to the second feedback signal having a low state being applied to the gate of the PMOS transistor P2B. The inverter 104B inverts and buffers the data stored on the second data node 114B.

The coupling between the first branch 102-A and the second branch 102-B is described. The first data node 114A is coupled to the gates of the PMOS transistor P2B and the NMOS transistor N2B to provide the second feedback signal. Likewise, the second data node 114B is coupled to the gates of the PMOS transistor P2A and the NMOS transistor N1A to provide the first feedback signal.

The fuses F1A and F1B are programmed to have different memory states. In particular, one of the two fuses F1A and F1B is programmed to have a high logic state and the other of the fuses F1A and F1B is programmed to have a low memory state.

The overall operation of the self-latching data circuit 100 is now described. During power up of the self-latching data circuit 100, the fuses F1A and F1B provide respective currents I1A and I1B that correspond to the memory state stored therein, and thus are different from each other. For clarity and simplicity, the operation of the self-latching data circuit 100is described for the fuse F1A having a low logic state and the fuse F1B having a high logic state, and thereby corresponding to the current I1A of the fuse F1A being less than the current I1B of the fuse F1B (I1B<I1B).

Figure 2:
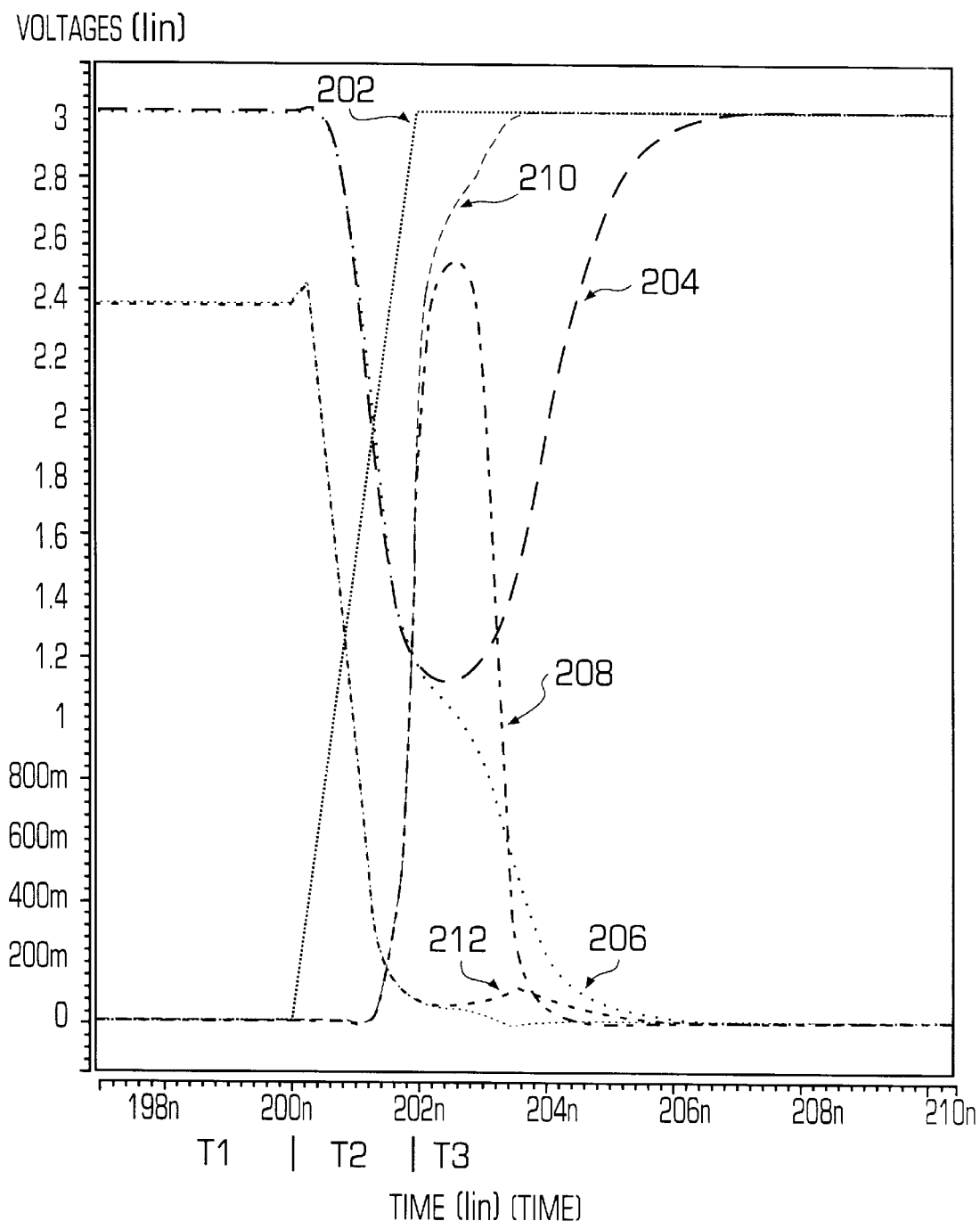
FIG. 2 is a timing diagram of the self-latching data circuit of FIG. 1.

FIG. 2 is a timing diagram of the self-latching data circuit 100. As an illustrative example, the timing diagram of FIG. 2 is a Simulation Program with Integrated Circuit Emphasis (SPICE) simulator of the self-latching data circuit 100.

A line 202 shows the time relationship of the enable signal. Lines 204 and 206 show the time relationship of the voltage on the first and second data nodes 114A and 114B, respectively. Lines 208 and 210 show the time relationship of the output of the inverters 104A and 104B, respectively. Line 212 shows the time relationship of the voltage on the node 112B.

At power up of the self-latching data circuit 100 during a first time interval T1 the operational voltage Vcc applied to the power signal line rises and settles at the voltage level Vcc. For the sake of illustration, an operational voltage Vcc of 3 volts is shown in FIG. 2. During a time interval T1 after power up of the self-latching data circuit 100, the enable signal has a zero voltage level (line 202 of FIG. 2) (EN=0). Accordingly, the NMOS transistors N2A and N2B are turned off and the contents of the fuses F1A and F1B are not being read. Conversely, the PMOS transistors P1A and P1B are on thereby coupling the first and second data nodes to the power supply line 110 to apply the operational voltage Vcc to the first and second data nodes 114A and 114B (lines 204 and 206, respectively). At this stage, the first and second data nodes 114A and 114B are at an equal voltage Vcc. During the time interval T1, the Vcc voltage on the first and second data nodes 114A and 114B are applied to the respective gates of the NMOS transistors N1B and N1A, respectively, thereby turning on the NMOS transistors N1A and N1B.

To load and latch data from the fuses F1A and F1B, the enable signal is transitioned from a low level to a voltage level Vcc during a second time interval T2. During the transition time T2, the PMOS transistors P1A and P1B are being turned off, and the NMOS N2A and N2B are being turned on to read the contents of the fuses F1A and F1B, or stated differently to apply the contents of the fuses F1A and F1B to the first and second input nodes 112-A and 112-B, respectively. As the enable signal transitions and becomes a high voltage level (EN=Vcc), the PMOS transistors P1A and P1B are turned off and the currents from the fuses F1A and F1B are applied to the data nodes 114A and 114B. Both the currents from the fuses F1A and F1B are being applied to the nodes 114A and 114B to provide the feedback for the corresponding NMOS transistors N1A and N1B. During the transition time interval T2, as the enable signal rises, the voltage on the data node 114A (line 204) and the data node 114B (line 206) both fall. At a time within the time interval T2, the feedback of the data nodes 114A and 114B start the latching of the data. The relative change in the voltage on the nodes 114A and 114B is dependent on the relationship of the currents I1A and I1B. In the illustrative example, the current I1A is less than the current I1B, the voltage on the node 114B falls faster than the voltage on the node 114A. The voltage on the node 114A is fed back to the gates of the PMOS transistor P2B and the NMOS transistor N1B. Likewise, the voltage on the node 114B is fed back to the gates of the PMOS transistor P2A and the NMOS transistor N1A. The current from the fuse F1B is greater than the current from the fuse F1A, so the NMOS transistor N1B is on more than the NMOS transistor N1A. Likewise, the current flow of the higher current on the node 114B causes the PMOS transistors P2A to be more saturated that the PMOS transistor P2B. This pulls up the voltage on the node 114A faster than the transistor P2B can pull up the voltage on the node 114B, and the current I1A flow through the PMOS transistors N2A is less than the corresponding current I1B flow through the PMOS transistor N1A, further pushing the voltage of the node 114B faster than the voltage of the node 114A. Because the voltage on the node 114B is falling faster than the voltage on the node 114A, the PMOS transistor P2A is being turned on faster than the PMOS transistor P2B. Accordingly, the NMOS transistor N1A is being turned off faster than the NMOS transistor N1B is being turned off. Accordingly, the PMOS transistor P2B is applying the voltage of the power supply line 110 to pull up the voltage on the node 114B. The voltage on the first data node 114A becomes sufficiently high.

After a third time interval T3, the voltage on the data nodes 114A (line 204) and the data node 114B (line 206) reaches a steady state. When the voltage of the node 114A is Vcc (line 204), the voltage on the node 114B is zero (line 206) and the PMOS transistor P2A is on, the NMOS transistor N1A is off, the PMOS transistor P2B is off and the NMOS transistor N1B is on. In this state, the self-latching data circuit 100 is self-latched and no current (I1B and I1B) flows through the first and second branch circuits 102A and 102A, respectively.

The self-latching data circuit 100 provides data to be read from the fuse circuits in response to a transition of the enable signal and to be latched without another transition in the enable signal. Thus, the self-latching data circuit 100 provides for loading and self-latching of data. The self-latching data circuit also provides for substantially no current draw when the self-latching data circuit is in a self-latched state.

What is claimed is:

1. A self-latching data circuit comprising:
   first and second memory cells;
   first and second NFETS coupled to the respective first and second memory cells for providing contents therein in response to an enable signal having a first state being applied to a gate of each of the first and second NFETS;
   a third NFET coupling the first NFET to a first data node;
   a fourth NFET coupling the second NFET to a second data node, the first data node being coupled to a gate of the fourth NFET, the second data node being coupled to a gate of the third NFET;
   a first PFET coupling a voltage signal to the first data node in response to the enable signal having the first state being applied to a gate thereof;
   a second PFET coupling the voltage signal to the second data node in response to the enable signal having the first state being applied to a gate thereof;
   a third PFET coupling the voltage signal to the first data node in response to the second data node; and
   a fourth PFET coupling the voltage signal to the second data node in response to the first data node.

2. A circuit comprising:
   a first subcircuit including:
      a first transistor of a first type having a drain coupled to a power signal line, having a gate, and having a source,
      a first transistor of a second type having a drain coupled to the source of the first transistor of the first type to form a first data node, having a gate coupled to the gate of the first transistor of the first type to form a first feedback node, and having a source, and
      a second transistor of the first type having a drain coupled to the power signal line, having a gate coupled to an enable signal line and having a source coupled to the first data node; and
   a second subcircuit comprising:
      a third transistor of the first type having a drain coupled to the power signal line, having a gate, and having a source,
      a second transistor of the second type having a drain coupled to the source of the third transistor of the first type to form a second data node and coupled to the first feedback node, having a gate coupled to the gate of the second transistor of the second type to form a second feedback node that is coupled to the first data node, and having a source coupled to a second input node; and
      a fourth transistor of the second type having a drain coupled to the power signal line, having a gate coupled to the enable line coupled to the gate of the second transistor of the second type to form a second feedback node and coupled to the first data node, and having a source coupled to the second data node.

3. The circuit of claim 2 wherein the first subcircuit is symmetric with the second subcircuit.

4. The circuit of claim 2 wherein the first subcircuit further includes a third transistor of the second type having a drain coupled to the source of the first transistor of the second type, having a gate coupled to the enable signal line, and having a source coupled to the first input node, and the second subcircuit includes a fourth transistor of the second type having a drain coupled to the source of the second transistor of the second type, having a gate coupled to the enable signal line, and having a source coupled to the second input node.

5. The circuit of claim 4 wherein the first and second input nodes are coupled to first and second memory cells, respectively.

6. A self-latching data circuit comprising:
   first and second memory cells storing data therein
   a first PFET having drain-source terminals coupling a power signal line to a first data node to initialize a voltage on the first data node to a voltage of the power signal line in response to an enable signal having a low logic level being applied to a gate of the first PFET;
   a second PFET having drain-source terminals coupling the power signal line to a second data node to initialize a voltage on the second data node to a voltage of the power signal line in response to the enable signal having a low logic level being applied to a gate of the second PFET;
   a first NFET having drain-source terminals coupling the first memory cell to a first input node to provide data in the first memory cell to the first input node in response to the enable signal having a high logic level being applied to a gate of the first NFET;

a second NFET having drain-source terminals coupling the second memory cell to a second input node to provide data in the second memory cell to the second input node in response to the enable signal having a high logic level being applied to a gate of the second NFET;

a third PFET having a gate coupled to the second data node and having drain-source terminals selectively conductive to couple the power signal line to the first data node in response to a voltage of the second data node being below the first voltage level, the amount of conductivity of the third PFET increasing with decreasing voltage;

a third NFET having a gate coupled to the second date node and having drain-source terminals selectively conductive to couple the first input node to the first data node in response to the voltage of the second data node being above the first voltage level, the amount of conductivity of the third NFET increasing with increasing voltage;

a fourth PFET having a gate coupled to the first data node and having drain-source terminals selectively conductive to couple the power signal line to the second data node in response to a voltage of the first data node being below the first voltage level, the amount of conductivity of the fourth PFET increasing with decreasing voltage; and a fourth NFET having a gate coupled to the first data node and having drain-source terminals selectively conductive to couple the second input node to the second data node in response to the voltage of the first data node being above the first voltage level, the amount of conductivity of the fourth NFET increasing with increasing voltage.

7. A method of loading and latching data, comprising:

applying a first voltage to first and second data nodes in response to an enable signal being in a first logic state;

applying a first current and a first voltage to the first node and a second voltage and a second current to the second node in response to the enable signal transitioning to a second logic state, said first and second currents being indicative of corresponding states of respective first and second memory elements;

modifying said first and second currents in response to the second and first currents, respectively, to reduce the voltage on one of the first and second node corresponding to the greater current of the first and second current and increasing the voltage on the other one of the first and second nodes corresponding to the lesser of the first and second currents; and ceasing the modification of the first and second currents in the event that the first and second currents are substantially equal to zero.

* * * * *